United States Patent
Lee et al.

(10) Patent No.: US 9,024,341 B2
(45) Date of Patent: May 5, 2015

(54) REFRACTIVE INDEX TUNING OF WAFER LEVEL PACKAGE LEDS

(75) Inventors: Hsiao-Wen Lee, Hsinchu (TW); Shang-Yu Tsai, Hsinchu (TW); Tien-Ming Lin, Hsinchu (TW); Chyi Shyuan Chern, Taipei (TW); Hsin-Hsien Wu, Hsinchu (TW); Fu-Wen Liu, Hsinchu (TW); Huai-En Lai, Fengshan (TW); Yu-Sheng Tang, Qishan Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 383 days.

(21) Appl. No.: 12/912,900

(22) Filed: Oct. 27, 2010

(65) Prior Publication Data
US 2012/0104435 A1     May 3, 2012

(51) Int. Cl.
*H01L 33/00* (2010.01)
*H01L 33/54* (2010.01)
*H01L 33/44* (2010.01)
*H01L 33/50* (2010.01)
*H01L 33/56* (2010.01)

(52) U.S. Cl.
CPC .............. *H01L 33/54* (2013.01); *H01L 33/44* (2013.01); *H01L 33/504* (2013.01); *H01L 33/507* (2013.01); *H01L 33/56* (2013.01); *H01L 2933/005* (2013.01); *H01L 2224/48091* (2013.01); *H01L 2924/0002* (2013.01); *H01L 2924/13091* (2013.01)

(58) Field of Classification Search
USPC ............. 257/98, 100, 99, 81, 79, 80, 22, 433; 438/FOR. 157, FOR. 416, 25, 26, 27
See application file for complete search history.

(56) References Cited

U.S. PATENT DOCUMENTS

| | | | |
|---|---|---|---|
| 6,155,699 A | 12/2000 | Miller et al. | |
| 6,541,800 B2 | 4/2003 | Barnett et al. | |
| 7,582,914 B2 | 9/2009 | Lin | |
| 7,667,239 B2* | 2/2010 | Pang et al. | 257/98 |
| 7,679,101 B2* | 3/2010 | Ota et al. | 257/100 |
| 7,847,302 B2* | 12/2010 | Basin et al. | 257/88 |
| 8,236,584 B1 | 8/2012 | Chem et al. | |
| 2007/0120135 A1* | 5/2007 | Soules et al. | 257/98 |
| 2008/0048200 A1* | 2/2008 | Mueller et al. | 257/98 |
| 2009/0008662 A1* | 1/2009 | Ashdown et al. | 257/98 |
| 2009/0250714 A1* | 10/2009 | Yun et al. | 257/98 |
| 2009/0256166 A1* | 10/2009 | Koike et al. | 257/98 |

FOREIGN PATENT DOCUMENTS

| | | |
|---|---|---|
| TW | M312019 | 5/2007 |
| TW | 200731558 | 8/2007 |
| TW | 200818539 | 4/2008 |

* cited by examiner

*Primary Examiner* — Thanh Y Tran
(74) *Attorney, Agent, or Firm* — Haynes and Boone, LLP

(57) ABSTRACT

Two or more molded ellipsoid lenses are formed on a packaged LED die by injecting a glue material into a mold over the LED die and curing the glue material. After curing, the refractive index of the lens in contact with the LED die is greater than the refractive index of the lens not directly contacting the LED die. At least one phosphor material is incorporated into the glue material for at least one of the lenses not directly contacting the LED die. The lens directly contacting the LED die may also include one or more phosphor material. A high refractive index coating may be applied between the LED die and the lens.

20 Claims, 12 Drawing Sheets

REFRACTIVE INDEX TUNING OF WAFER LEVEL PACKAGE LEDS

FIELD OF THE INVENTION

The present disclosure relates generally to a semiconductor device, and more particularly, to semiconductor lighting emitting diode (LED).

BACKGROUND

A Light-Emitting Diode (LED), as used herein, is a semiconductor light source for generating light at a specified wavelength or a range of wavelengths. LEDs are traditionally used for indicator lamps, and are increasingly used for displays. An LED emits light when a voltage is applied across a p-n junction formed by oppositely doping semiconductor compound layers. Different wavelengths of light can be generated using different materials by varying the bandgaps of the semiconductor layers and by fabricating an active layer within the p-n junction.

A phosphor material is usually added to change the properties of light generated by the LED. For example, the monochromatic light provided by an LED can be converted to a polychromatic light through the application of several phosphors, either in a mixture or several phosphor layers. The phosphors Stokes-shift blue light or other shorter wavelength light to a longer wavelength. The perception of white may be evoked by generating mixtures of wavelengths that stimulate all three types of color sensitive cone cells (red, green, and blue) in the human eye in nearly equal amounts and with high brightness compared to the surroundings in a process called additive mixing. The white light LED may be used as lighting, such as back lighting for various display devices, commonly in conjunction with a liquid crystal display (LCD).

Traditionally, LEDs are made by growing a plurality of light-emitting structures on a growth substrate. The light-emitting structures along with the underlying growth substrate are separated into individual LED dies. At some point before or after the separation, electrodes or conductive pads are added to the each of the LED dies to allow the conduction of electricity across the structure. LED dies are then packaged by adding a package substrate, a reflector, phosphor material, and lens to become an optical emitter.

While existing methods of packaging an LED have been generally adequate for their intended purposes, they have not been entirely satisfactory in every aspect. More efficient methods and designs that extract more of the light generated and improve uniformity of the phosphor and color distribution continue to be sought.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

SUMMARY

Figure 1:
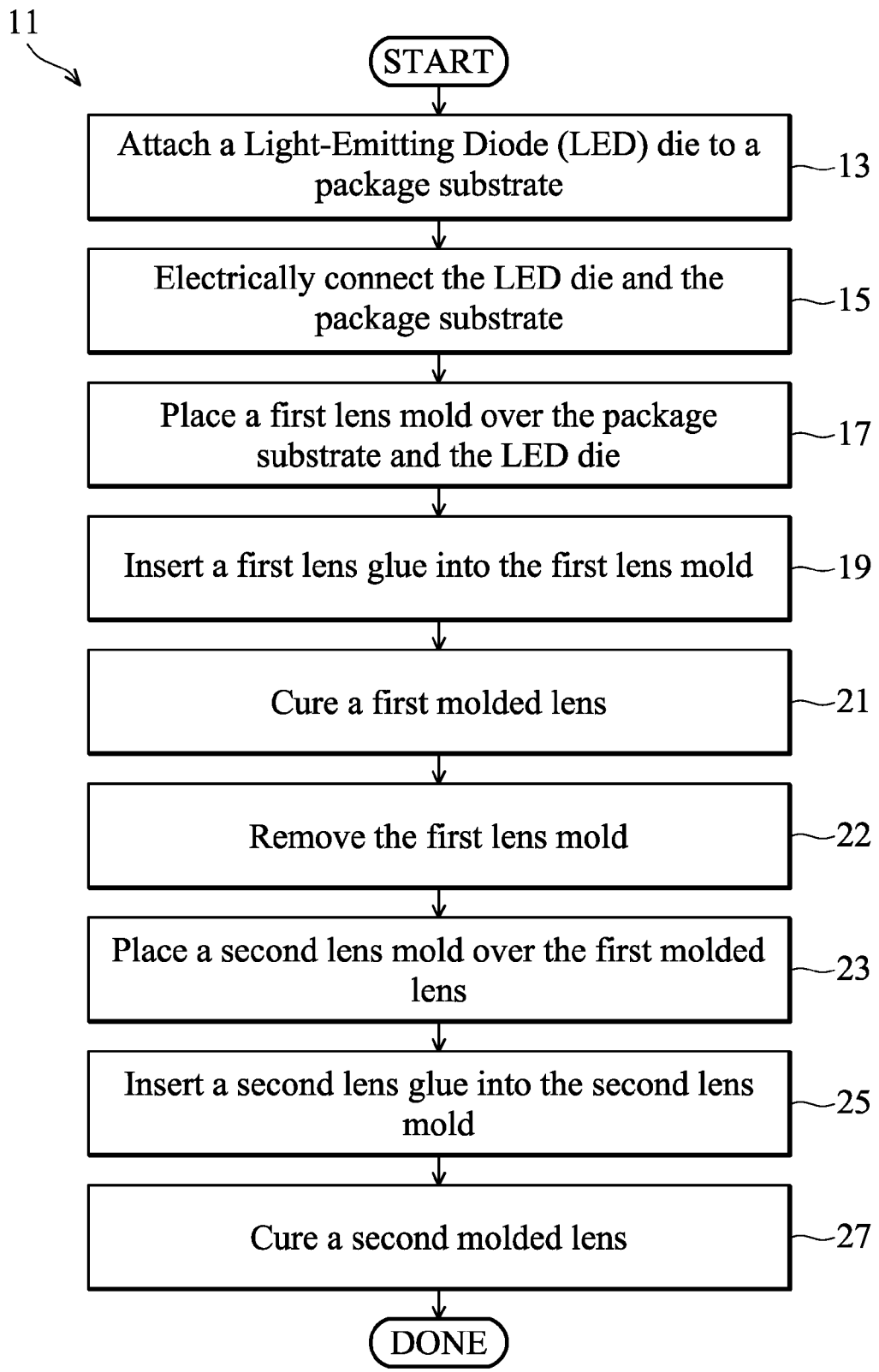
FIG. 1 is a flowchart illustrating a method of fabricating an optical emitter according to various aspects of the present disclosure.

One aspect of the present disclosure involves an optical emitter including a Light-Emitting Diode (LED) die, a package substrate attached to one side of the LED die, electrical connections connecting the LED die and the package substrate, a first molded lens bonded to the package substrate directly contacting the LED die, and a second molded lens over and bonded to the first molded lens. The second molded lens includes at least one phosphor material. An index of refraction of the first molded lens is higher than an index of refraction of the second molded lens.

Another aspect of the present disclosure involves a method of fabricating an optical emitter. The method includes attaching an Light-Emitting Diode (LED) die to a package substrate, electrically connecting the LED die and the package substrate, placing a first lens mold over the package substrate and the LED die, inserting a first lens glue into the first lens mold, curing a first molded lens, placing a second lens mold over the first molded lens, inserting a second lens glue into the second lens mold, and curing a second molded lens.

These and other features of the present disclosure are discussed below with reference to the associated drawings.

DETAILED DESCRIPTION

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Of course, the description may specifically state whether the features are directly in contact with each other. In addition, the present disclosure may repeat reference numerals and/or letters in the various examples. This repetition is for the purpose of simplicity and clarity and does not in itself dictate a relationship between the various embodiments and/or configurations discussed.

A conventional LED package includes an LED die attached to a package substrate and a layer of phosphor material coating over the LED die. The LED die may be electrically connected to circuitry on the package substrate in a number of ways. One conventional connection method involves attaching the growth substrate portion of the die to the package substrate, and forming electrode pads that are connected to the p-type semiconductor layer and the n-type semiconductor layer in the light-emitting structure on the die, and then bond wiring from the electrode pads to contact pads on the package substrate. Another conventional connection method involves inverting the LED die and using solder bumps to connect the electrode pads on the light-emitting structure directly to the package substrate. Yet another conventional connection method involves using hybrid connectors. One semiconductor layer, for example the p-type layer, may be wire bonded to the package substrate while the other layer (n-type layer) may be soldered to the package substrate.

The conventional LED package also includes one or more phosphor materials that are usually applied directly onto the LED die. Conventional methods of applying the one or more phosphor materials include spraying or dropping the phosphor materials in a concentrated viscous fluid medium, for example, liquid glue, onto the surface of the LED die through which the generated light must pass. As the viscous fluid sets or cures, the phosphor material becomes a part of the LED package. The conventional LED package also includes a lens over the LED die coated with phosphor. The lens may be made of plastic, epoxy, or silicone and is attached to the package substrate by gluing its edge onto the package substrate. Usually, the lens is manufactured separately from the LED die and is available in specific sizes and shapes. Thus, in a conventional package, light generated by the LED die travels through a sapphire growth substrate if the LED is solder bonded to the package substrate, one or more layers of phosphor material on the die, a gap between the phosphor and the lens, and through the lens itself.

The optical emitter of the present disclosure involves first and second lenses molded directly on the LED die. A first lens is molded directly over the LED die by inserting a first lens glue into a first lens mold that is placed over the LED die and package substrate. The first lens glue insertion may be aided by contemporaneously removing air from the mold cavity. Alternatively, the operation may be performed in a vacuum environment. The first lens glue is cured before the first lens mold is removed. A second lens is then molded directly over the LED die by inserting a second lens glue into a second lens mold that is placed over the first lens, LED die and package substrate. The second lens glue insertion may also be aided by contemporaneously removing air from the second lens mold cavity. The second lens is also cured before the second lens mold is removed.

The resulting optical emitter includes an LED die attached to a package substrate, electrical connections between the LED die and the package substrate, a first lens formed and molded over the LED die, and a second lens formed and molded over the first lens. At least the second lens and/or the first lens include one or more phosphor material. In some embodiments, the indices of refraction of the first lens and the second lens are similar, at about 1.4 to 1.6. The index of refraction for the first lens is greater than the index of refraction for the second lens. Because the first lens is formed directly over the LED die and the second lens formed directly over the first lens, the optical emitter does not include any gaps.

Phosphor efficiency depends on its temperature and time. At higher temperatures, many phosphor materials have decreased efficiency—such that less luminescent light is generated. Thermal cycling, presence of moisture and oxidants can also affect the phosphor efficiency and decrease the lifetime of phosphor material. Some of these factors cause irreversible efficiency decay while other modes of decay are reversible.

In a conventional LED package, the phosphor material is formed directly and concentrated on the LED die and its temperature is the same as the LED die. When the LED is on and gets hot, so does the phosphor material. In this sense the phosphor material is thermally cycled whenever the LED is used. Some high output LEDs can get quite hot at well over 100° C. even with heat dissipation mechanisms. When the phosphor material is a part of a lens formed away from the LED die, the temperature of the phosphor material is lower during LED operation. In embodiments in which the phosphor material is present in the first molded lens that is formed directly on the LED die, the phosphor temperature is lower as compared to the conventional phosphor coating because the phosphor material is more dispersed in the first molded lens. Thus the phosphor material of an optical emitter in accordance with various embodiments of the present invention does not reach as high temperature and is not subject to as harsh thermal cycling as that of a conventional LED package.

Some conventional LED packages are not hermetically sealed and allow some moisture into the lens cavity. Ambient air may be sealed in the gap between the phosphor and the lens during packaging and cause unwanted phosphor efficiency decay. In accordance with various embodiments of the present disclosure, the phosphor material of an optical emitter is not subjected to moisture or oxidants because the phosphor is encased and cured in the lens material.

Depending on the geometries of the various components, the light generated in a conventional LED package may be partially reflected in a Fresnel reflection due to the disparate indexes of refraction (n) between the LED die (n is 2.5), phosphor material glue medium (n about 1.4-1.6), a gap (n about 1), and then the lens material (n about 1.4-1.6). The Fresnel equations describe the behavior of light when moving between media of differing refractive indices. When light moves from a medium of a given refractive index $n_1$ into a second medium with refractive index $n_2$, both reflection and refraction of the light occurs. The fraction of the incident light that is reflected from the interface is given by the reflectance R and the fraction that is refracted is given by the transmittance T. When the light is at near-normal incidence to the interface ($\theta_i \approx \theta_r \approx \theta$), the reflection and transmission coefficients are given by:

$$R = \left(\frac{n_1 - n_2}{n_1 + n_2}\right)^2 \text{ and } T = 1 - R$$

In the conventional LED package when the light moves from a high refractive index medium (i.e., the LED die at about 2.5 to phosphor coating material at about 1.5 or about 1.45) to a lower refractive index medium (i.e., air/vacuum/other gas within gap at about 1), a portion of the light is reflected back onto the LED die, depending on the angle of incidence. At the lens (refractive index is about 1.5), an additional amount of light is reflected back toward the LED die. Because the conventional LED package includes multiple interfaces and surfaces that can reflect light, the multiple beams of light may interfere with one another. Generally, more of the light energy is lost when the difference in indices of refraction is greater between adjacent materials. In a conventional LED package, up to 20% of light generated may be lost due to the multiple reflection and interferences.

The optical emitter in accordance with various embodiments of the present disclosure reduces the amount of light lost by reflection at interfaces between materials with different indices of refraction. In various embodiments, by forming the first lens directly over the LED die and forming the second lens directly over the first lens, the optical emitter in accordance with various embodiments of the present invention does not include any gaps, which would have a significantly different index of refraction as compared to the phosphor material and the lens. As the refraction coefficient equation shows, a smaller difference in indices of refraction means less light would be reflected at near normal incidence. The first lens material may be chosen such that its refractive index is between that of the second lens material and the LED die. Generally, the first lens material is chosen to have as high refractive index as practical that is lower than the LED die.

The second lens material is chosen to have as low refractive index as practical that is higher than air. In certain embodiments, a high refractive index coating layer may be applied between the LED die and the first lens. The high refractive index coating has an index of refraction lower than an index of refraction of the LED die and higher than an index of refraction of the first molded lens. In some cases, the index of refraction of the high refractive index coating is between about 1.6 and about 1.9. In some cases, the index of refraction of the high refractive index coating is within ten percent of the average between the index of refraction of the LED die and the index of refraction of the first molded lens. In one embodiment involving the use of a high refractive index coating, the second lens is not used, and the phosphor material is incorporated in a separate layer between the high refractive index coating and the first lens or as a part of the second lens.

A variety of materials may be used as the first lens and the second lens. Suitable materials have a high optical permissivity (transparency), a viscosity suitable for molding, appropriate adhesive characteristics with regard to the package substrate, and good thermal conductivity and stability (i.e., do not degrade or change color during thermal cycling). Example materials include silicone, epoxy, certain polymers, resins and plastics including Poly(methyl methacrylate) (PMMA). Suitable materials are flowable for molding into the lens and can be cured into a defined shape. Some suitable materials may have thermal expansion coefficients that are similar to that of the package substrate and/or can absorb stress caused by a difference in the thermal expansion during thermal cycling. As understood in the industry, a manufacturer can adjust the refractive index of the lens material as a customer specifies. Thus, one skilled in the art can first select a suitable lens material for the first lens and the second lens based on suitable material properties other than the refractive index first, and then specify the refractive index within a range that can be supplied by the manufacturer. In certain embodiments, the first lens and second lens are made of the same basic material with different refractive indices.

The material selection of the high refractive index coating involves some similar considerations as the first and second lens. The high refractive index material may be applied onto the LED die by dispensing, spin coating, or printing methods; thus, the high refractive material should have a viscosity and other properties suitable for these methods. More importantly, the high refractive index material should be highly transparent, with optical permissivity in the visible wavelengths of over about 90%, over about 95%, or over about 97%. The material also should not crack or yellow with normal LED operation within an average lifetime. An example of a suitable material is certain epoxy-resin material with selected dopants that can be tuned to achieve particular refractive indices between about 1.6 to about 1.9. Known dopants include fluorine, other halogens, sulfur, and small oxide particles of Si, Ti, Zr, Al, Ta, Zn, Sn, Sb, Zr, Be, Ce, Pb, Ge, and Bi. A suitable dopant may be selected based on cost and desired material properties as the dopant may also provide particular properties such as thermal conductivity and UV stability.

As an example, the transmission of light can be from the LED die at n of about 2.5, a first lens at n of 1.53, a second lens at n of 1.43, and to air at about 1. The total Fresnel reflection would then be reduced to less than 10%, or down to about or less than 5% by optimized shaping of the first lens to avoid total internal reflection of the light from the LED. In another example, the transmission of light can be from the LED die at n of about 2.5, a high refractive index coating at an n of 1.85, a first lens at n of 1.53, a second lens at n of 1.43, and to air at about 1. The total Fresnel reflection would then be reduced to less than 5%, or down to about 3% attributable to this optical path.

Total internal reflection is an optical phenomenon that occurs when a ray of light strikes a boundary between two media at an angle larger than a particular critical angle with respect to the normal to the surface. At this larger angle, if the refractive index is lower on the other side of the boundary, no light can pass through and all of the light is reflected. The critical angle is the angle of incidence above which the total internal reflection occurs. If the angle of incidence is greater (i.e. the ray is closer to being parallel to the boundary) than the critical angle—the angle of incidence at which light is refracted such that it travels along the boundary—then the light will stop crossing the boundary altogether and instead be totally reflected back internally. The first lens and the second lens of the optical emitter in accordance with various embodiments of the present disclosure are each a portion of an ellipsoid. The ellipsoidal shape increases extraction efficiency by reducing the likelihood of total internal reflection and increasing the likelihood of near-normal transmission by reducing the angle of incidence.

Figure 12:
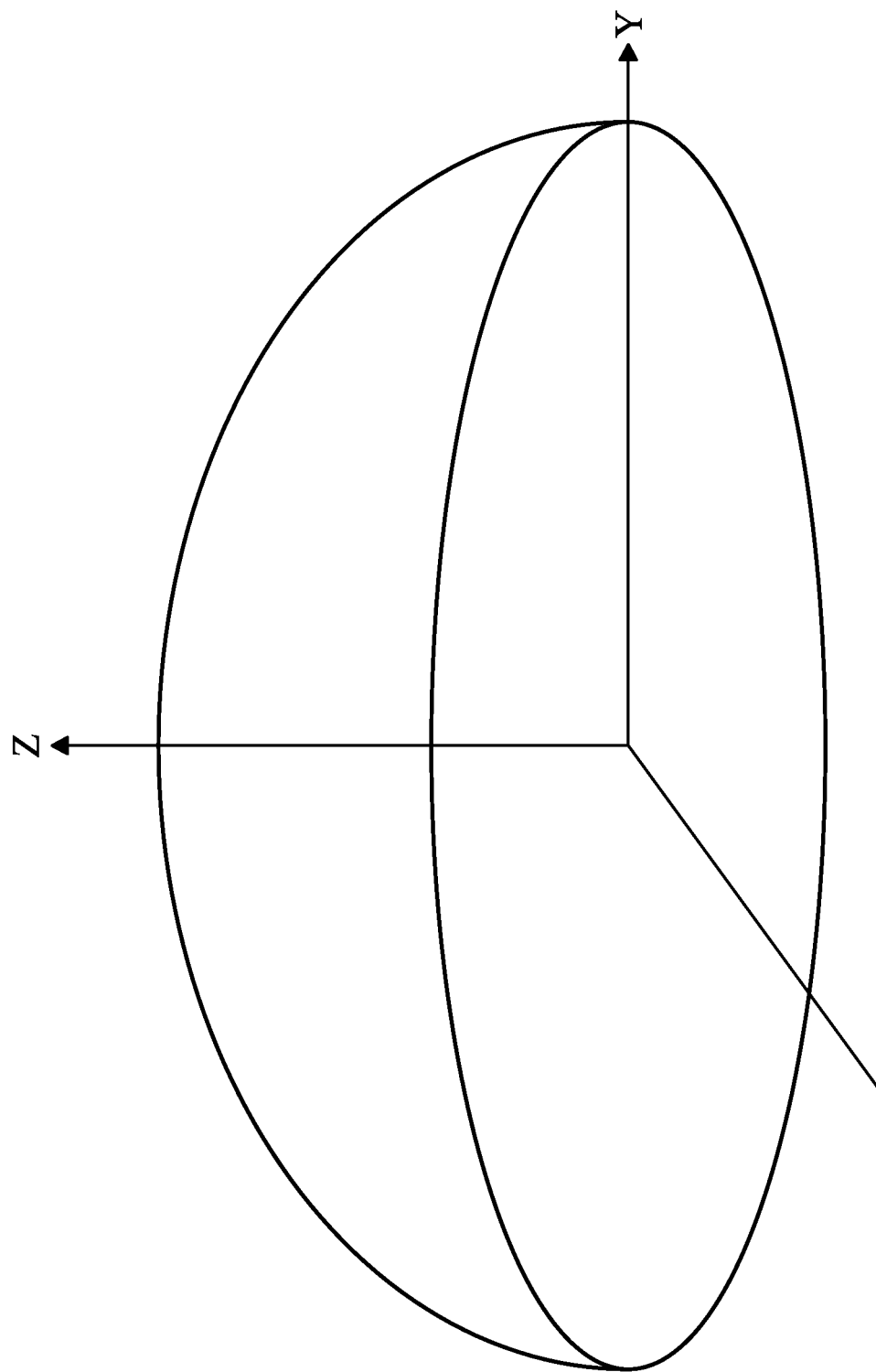
FIG. 12 illustrates coordinate dimensions for a portion of an ellipsoid.

As shown in FIG. 12, an ellipsoid is a higher dimensional analogue of an ellipse. The ellipsoid has three radii: two equatorial radii along the x and y-axis and a polar radius along the z-axis. When all radii are the same, the ellipsoid is a sphere. The first lens and the second lens of the optical emitter in accordance with various embodiments of the present disclosure have centers along the same z-axis. In certain embodiments, the ellipsoids of the first lens and the second lens have unequal equatorial radii.

In the conventional LED package, the phosphor material is sprayed or dropped as a concentrated viscous fluid onto the surface of the LED die. The phosphor distribution may be non-uniform across the LED die due to difficulties in controlling the process. A mixture of phosphor particle sizes may not mix evenly. The volume of each spray and drop also should be the same. The phosphor material may spread around the LED die. A non-uniform phosphor distribution coupled with non-uniform light generation across the LED die would also cause non-uniform color distribution.

The optical emitter in accordance with various embodiments of the present disclosure may improve the uniformity of the phosphor and therefore the color distribution. The phosphor material is dispersed over a higher volume of lens material than the conventional phosphor coating. The shape of the lens containing the phosphor is created by a lens mold that is more consistent than a drop or spray (and a small difference in the spray head would affect the shape of the phosphor coating). Thus the optical emitter in accordance with various embodiments of the present disclosure provides better color uniformity.

Illustrated in FIG. 1 is a flowchart of a method 11 for fabricating an optical emitter in accordance with the present disclosure. FIGS. 2 to 11 are diagrammatic fragmentary cross-sectional side views of the optical emitter during various fabrication stages in accordance with one embodiment of the method 11 in FIG. 1. The optical emitter may be a standalone device or a part of an integrated circuit (IC) chip or system on chip (SoC) that may include various passive and active microelectronic devices such as resistors, capacitors, inductors, diodes, metal-oxide semiconductor field effect transistors (MOSFET), complementary metal-oxide semiconductor (CMOS) transistors, bipolar junction transistors (BJT), laterally diffused MOS (LDMOS) transistors, high power MOS transistors, or other types of transistors. It is understood that FIGS. 2 to 11 have been simplified for a better understanding of the inventive concepts of the present disclosure. Accordingly, it should be noted that additional processes may be provided before, during, and after the method 11 of FIG. 1, and that some other processes may only be briefly described herein.

Figure 2:
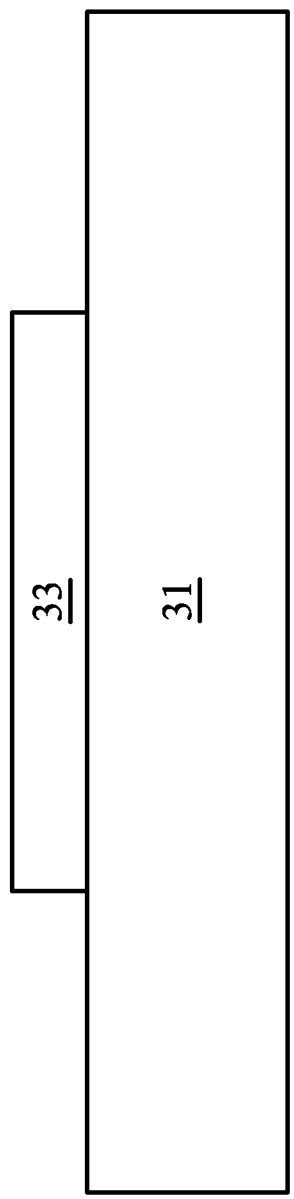
FIGS. 2-11 illustrate cross-sectional views of the optical emitter at various stages of fabrication according to an embodiment of the method of FIG. 1.

Referring to FIG. 1, the method 11 begins with block 13 in which a Light-Emitting Diode (LED) die is attached to a package substrate. FIG. 2 shows a cross-sectional view of an LED die 33 attached to package substrate 31. LED die 33 includes a light-emitting structure (not shown) and one or more electrode pads for electrically connecting to a package substrate, the details of which are not shown in FIG. 2. While the following disclosure refers to an optical emitter with a blue LED, the concepts describes herein could apply to other color LEDs and even those without phosphors. The light-emitting structure has two doped layers and a multiple quantum well (MQW) layer between the doped layers. The doped layers are oppositely doped semiconductor layers. In some embodiments, a first doped layer includes an n-type gallium nitride material, and the second doped layer includes a p-type material. In other embodiments, the first doped layer includes a p-type gallium nitride material, and the second doped layer includes an n-type gallium nitride material. The MQW layer includes alternating (or periodic) layers of active material, for example, gallium nitride and indium gallium nitride. For example, in one embodiment, the MQW layer includes ten layers of gallium nitride and ten layers of indium gallium nitride, where an indium gallium nitride layer is formed on a gallium nitride layer, and another gallium nitride layer is formed on the indium gallium nitride layer, and so on and so forth.

The doped layers and the MQW layer are all formed by epitaxial growth processes. After the completion of the epitaxial growth process, a p-n junction (or a p-n diode) is essentially formed. When an electrical voltage is applied between the doped layers, an electrical current flows through the light-emitting structure, and the MQW layer emits light. The color of the light emitted by the MQW layer is associated with the wavelength of the emitted radiation, which may be tuned by varying the composition and structure of the materials that make up the MQW layer. The light-emitting structure may optionally include additional layers such as a buffer layer between the substrate and the first doped layer, a reflective layer, and an ohmic contact layer. A suitable buffer layer may be made of an undoped material of the first doped layer or other similar material. A light-reflecting layer may be a metal, such as aluminum, copper, titanium, silver, silver, alloys of these, or combinations thereof. An ohmic contact layer may be an indium tin oxide (ITO) layer. The light reflecting layer and ohmic contact layer may be formed by a physical vapor deposition (PVD) process, a chemical vapor deposition (CVD), or other deposition processes.

The LED die may be attached to the package substrate in a number of ways. In certain embodiments where the growth substrate side of the LED die is attached to the package substrate, the attachment may be performed by simply gluing the LED die using any suitable conductive or non-conductive glue. In embodiments where the LED die side opposite of the growth substrate is attached to the package substrate, the attachment may include electrically connecting the LED die by bonding the electrode pads on the LED to contact pads on the package substrate. This bonding may involve soldering or other metal bonding. In some embodiments, the growth substrate is removed and one side of the LED die is bonded and electrically connected to the substrate. In this case the attaching process may be accomplished using metal bonding such as eutectic bonding.

Figure 3:
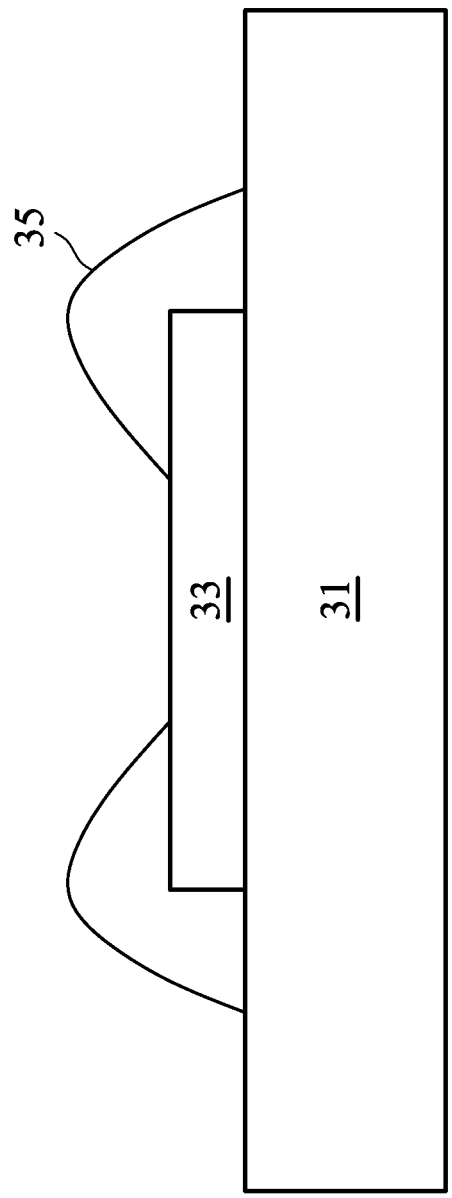

After the LED die is attached to the substrate, the LED die is electrically connected to the package substrate in operation 15 of FIG. 1. At least two electrical connections are made, one each to the p-type and n-type doped layers. In some cases, two electrical connections are made to the p-type layer for current spreading purposes. As discussed, the electrical connection may involve wire bonding, soldering, metal bonding, or a combination of these. FIG. 3 shows electrical connections 35 between the LED die 33 attached to a package substrate 31. Because the electrical connection 35 may take a variety of forms, the structure shown in FIG. 3 is illustrative only—the electrical connections 35 need not be a wire bond.

A high refractive index coating is optionally applied on the LED die in operation 16. A high refractive index coating having a refractive index between that of adjacent layers on either side of the optical transmission path can reduce the total Fresnel reflection. For example, the high refractive index coating may a refractive index between about 1.6 and 1.9, which is between the refractive index of the LED die at about 2.5 and the lens at about 1.5. This coating may be dispensed directly on the LED die, spin coated and then cured, or printed on the LED die using a slit coating process. This coating is usually a conformal layer such as layer 34 as shown in FIG. 3, covering the top portion and the sidewalls of the LED die 33. This high refractive index material may be an epoxy with a thickness of about 1 mm. Also optionally, a phosphor coating may be applied over the high refractive index coating instead or in addition to being a component of one or both of the lens materials.

Figure 4:
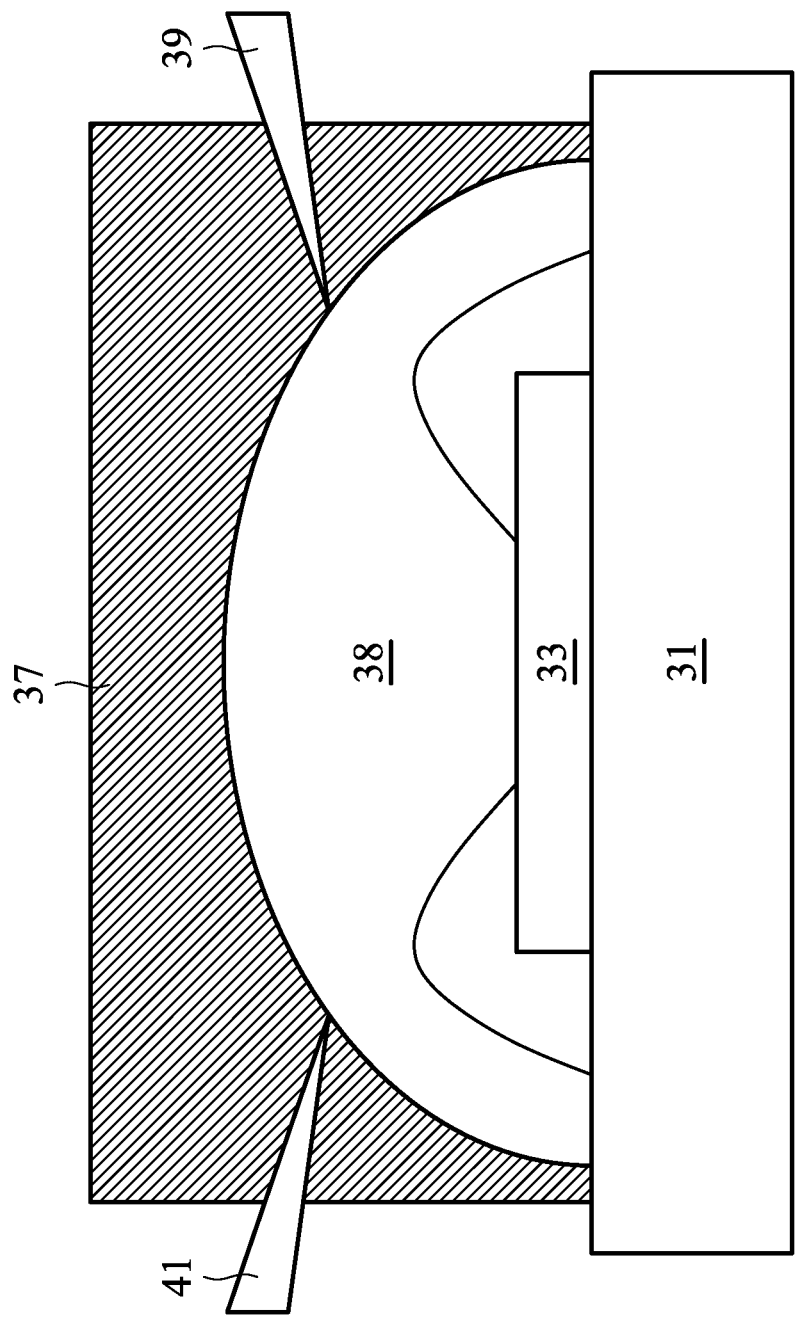

A first lens mold is placed over the package substrate and the LED die in operation 17 of FIG. 1. Referring to FIG. 4, a first lens mold 37 is placed over LED die 33. The first lens mold 37 includes multiple openings such as openings 39 and 41. The position and number of openings on the first lens mold 37 as depicted is illustrative and not limiting. More openings may be used and the openings may be located at different places. FIG. 4 illustrate one mold cavity 38 placed over one LED die, however, the first lens mold may include multiple mold cavities that would fit over a package substrate having many LED dies 33 attached thereon. The package substrate may include alignment marks between individual LED dies to ensure that the mold cavities are placed accurately over the LED die.

Figure 5:
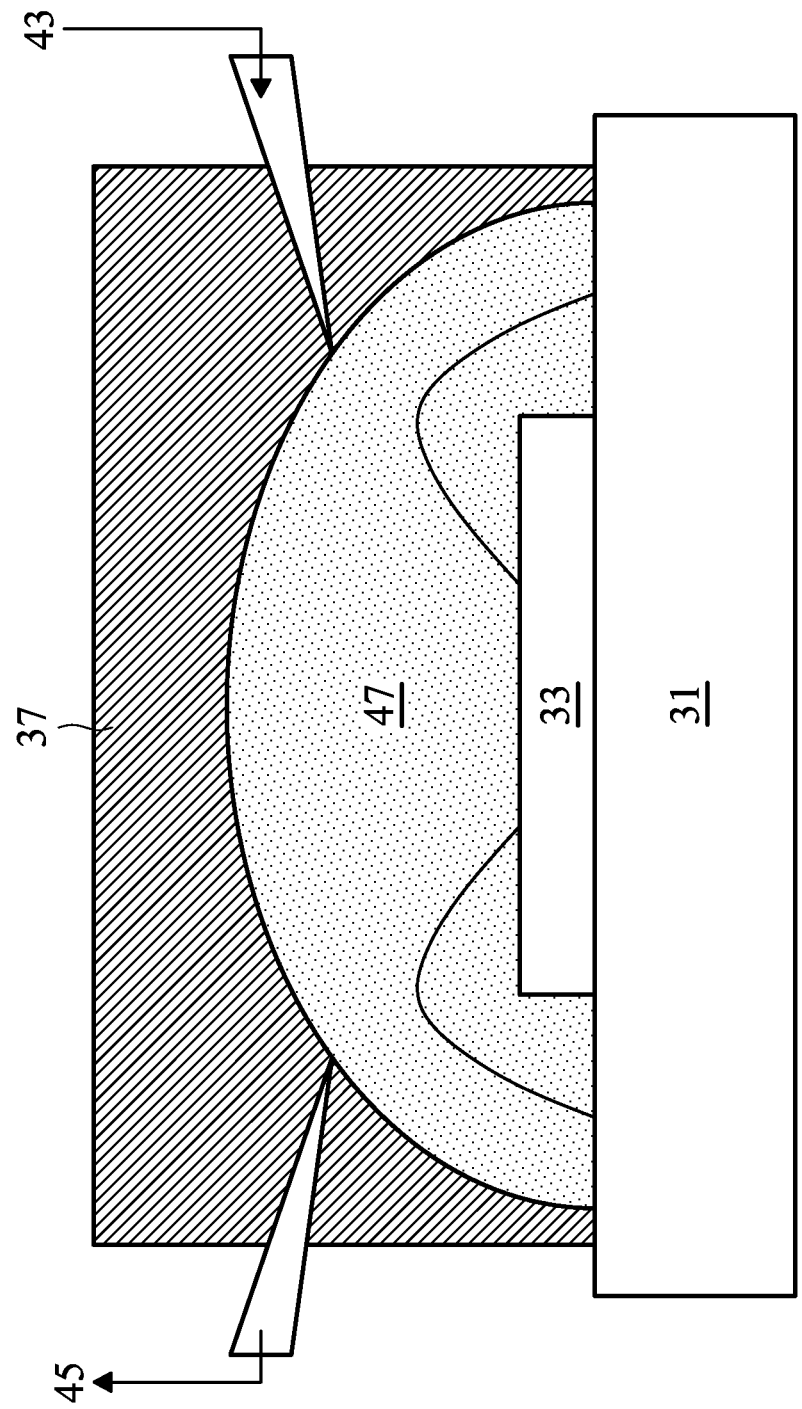

A first lens glue or molding material is inserted into the first lens mold in operation 19 of FIG. 1. This operation is illustrated in FIG. 5. The first lens glue 43 is inserted or injected into the mold cavity 38. To ensure a good fill, the gas inside the mold cavity 38 may be evacuated through one or more openings 45. The gas inside the mold cavity 38 may be air or an inert gas such as nitrogen. Alternatively, this operation is performed in a vacuum environment, in which case opening 45 is not used. The first lens glue 43 may be heated or under pressure. The first lens glue 43 fills the mold cavity 38 to form the first lens 47.

Figure 6:
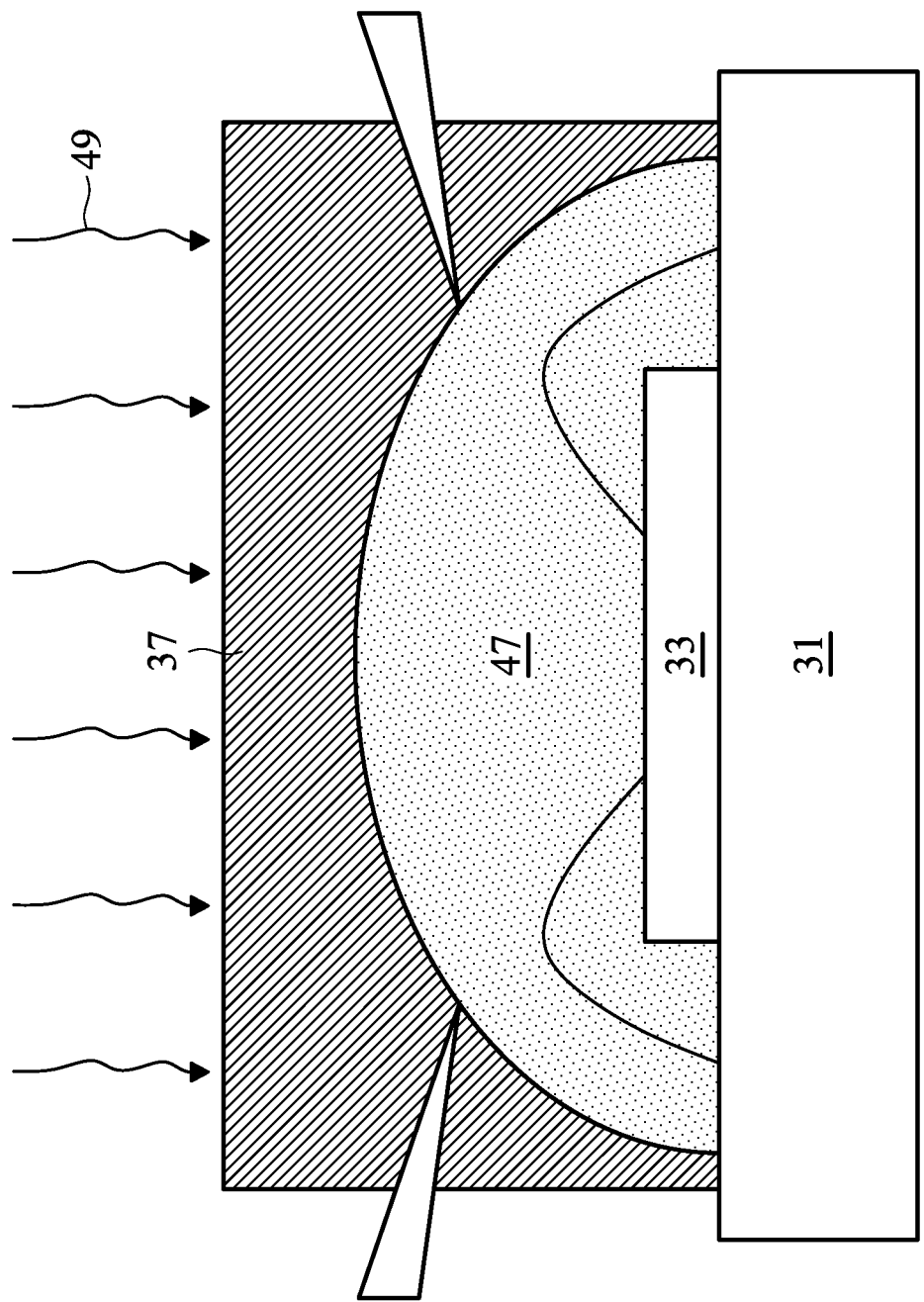

The first lens 47 is cured in operation 21 of FIG. 1 to set so that it retains its shape and adheres to the package substrate and LED die. FIG. 6 illustrates the curing process. Radiation 49 is applied to the first lens mold that is transparent to the radiation 49. The radiation may be an ultraviolet (UV) radiation, thermal radiation (infrared), microwave, or another radiation that can cure the first lens glue. Glue materials that cure under UV light or under heat application are commercially available. Further, thermal energy need not be applied in the form of radiation. Conductive heat energy may be applied through the package substrate or through heating of the first lens mold.

Figure 7:
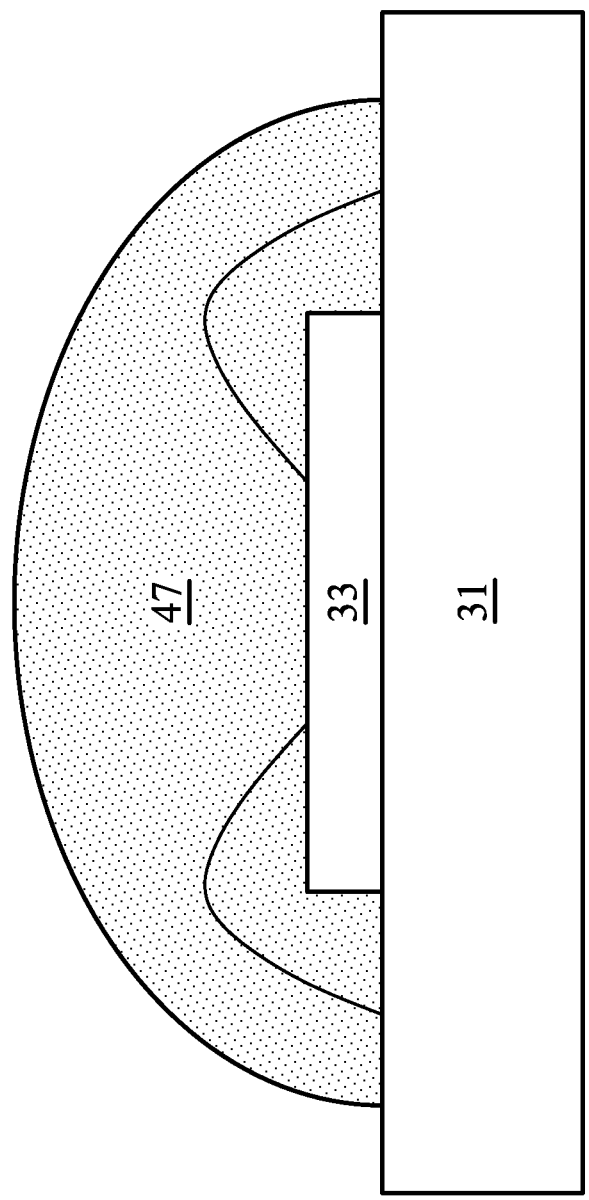

After the first lens has cured, the first lens mold may be removed in operation 22. The first lens mold is removed so as not to remove the first lens from the package substrate. In one embodiment, some gas can be added via one or all of the mold openings such as opening 45 to help separate the first lens 47 from the first lens mold 37. Other techniques include changing the temperature of either the molded lens or the lens mold such that a temperature difference exists. FIG. 7 shows the partially fabricated optical emitter having a first lens 47 molded onto the LED die 33 and package substrate 31.

Figure 8:
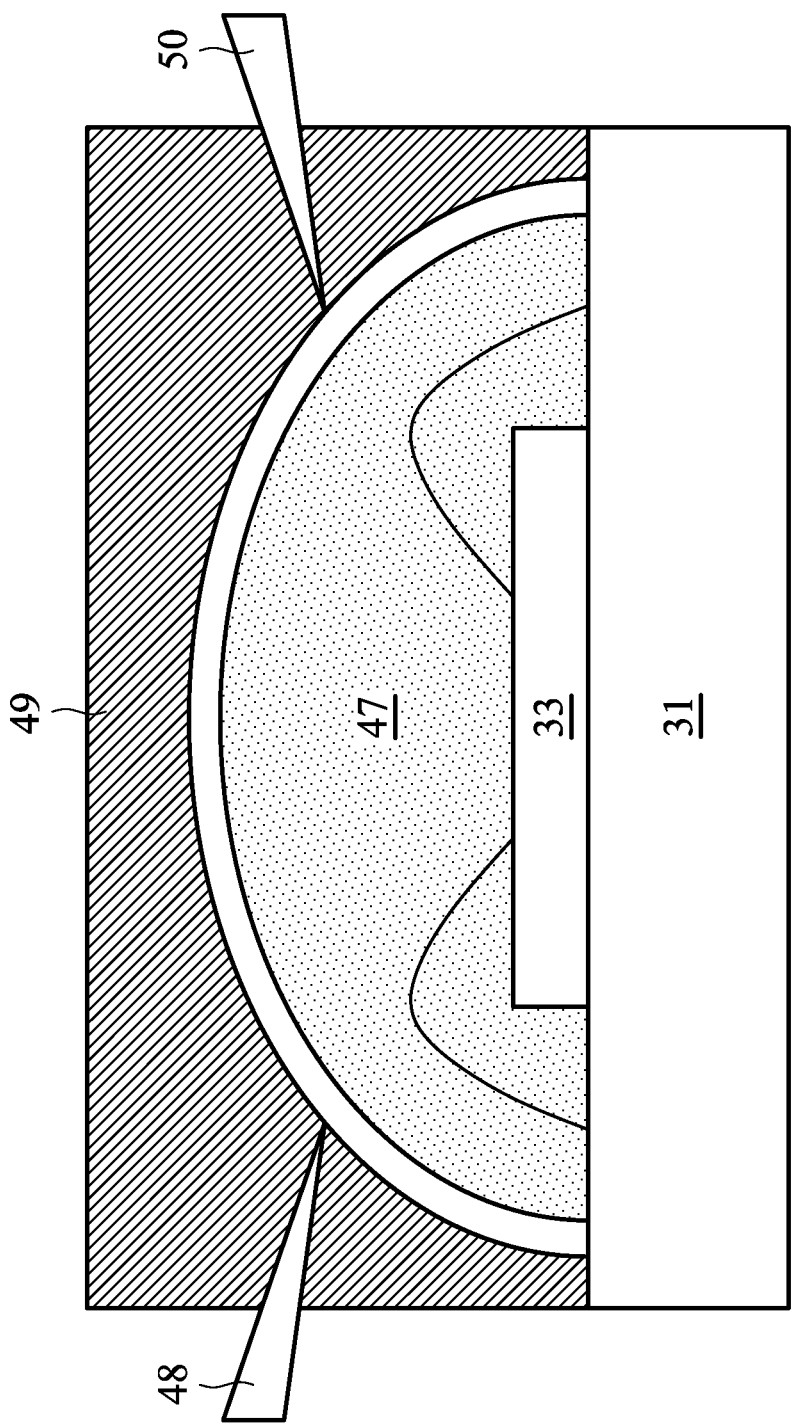

In operation 23 of FIG. 1, a second lens mold is placed over the first molded lens. FIG. 8 illustrates a second lens mold 49 placed over the first lens 47. The second lens mold 49 has a larger mold cavity than the first lens mold for forming a second lens over the first lens. The cavity in the second lens mold 49 has an ellipsoidal shape. Similar to the first lens mold, the second lens mold also includes a number of openings, shown as openings 48 and 50. Similar to operation 17 of FIG. 1 as discussed herein, the second lens mold 49 is placed so that it is centered over the first lens 47.

Figure 9:
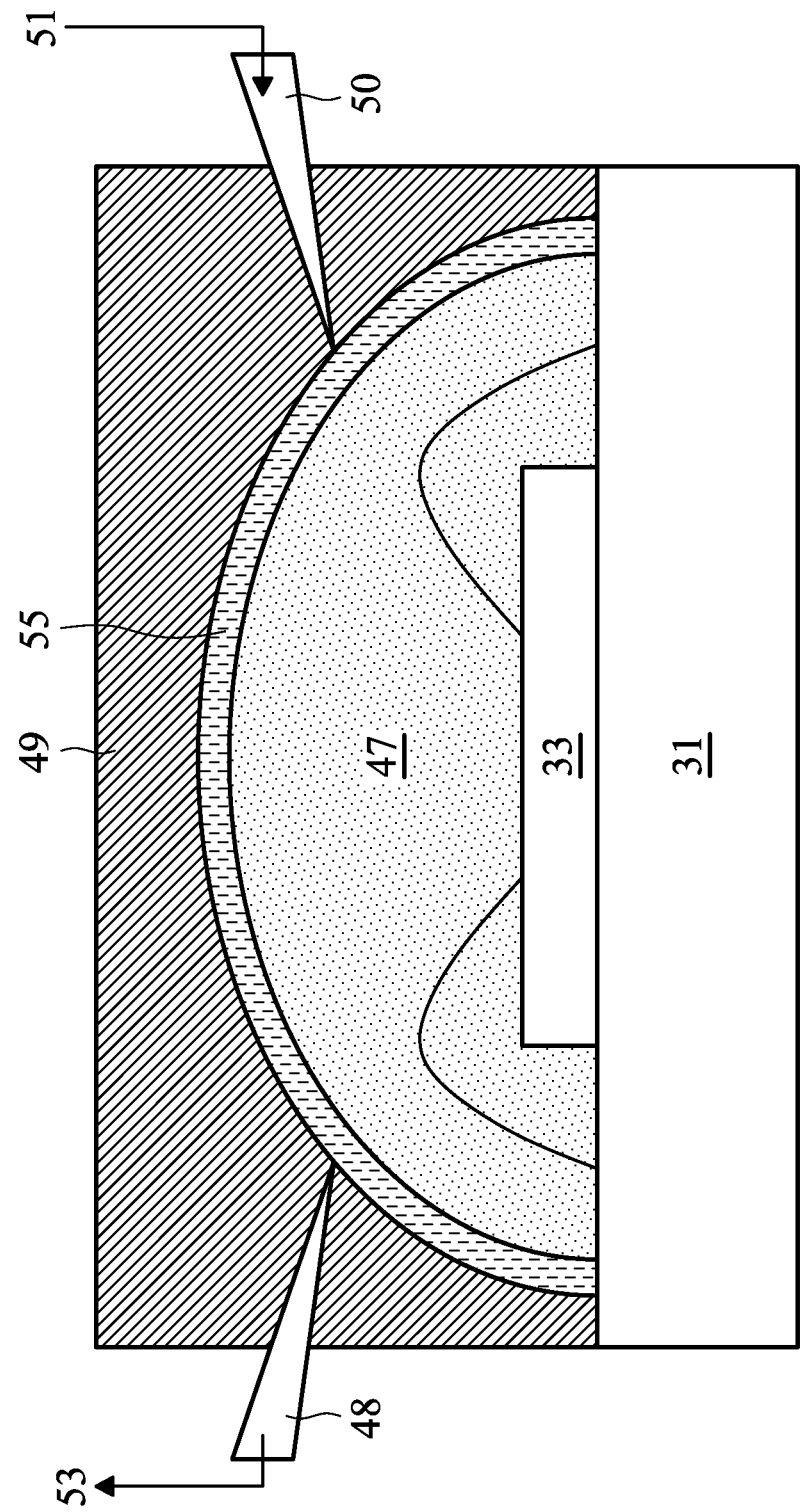

In operation 25 of FIG. 1, a second lens glue is inserted or injected into the second lens mold. FIG. 9 illustrates this operation where at least one opening (i.e., opening 50) is used for injecting a second lens glue 51 to form the second lens 55. At least one opening (i.e., opening 48) may be used to evacuate the cavity so the lens glue 51 fills adequately. Alternatively, the operation may be performed in a vacuum environment.

The lens glue 51 may be different from the first lens glue 43 or the same and may include the same phosphors. To generate white light from the optical emitter, at least one phosphor material is used. For example, a white light may be generated using a blue LED with a yellow phosphor or with a red phosphor and green phosphor. A yellow phosphor material may be included in the first lens or the second lens. Similarly, a green and red phosphor material may be included in either the first lens or the second lens, or both. In another embodiment, the first lens may include a green phosphor and the second lens may include a red phosphor. In other examples, a white light may be generated using an ultraviolet (UV) LED with at least two phosphors: blue and yellow phosphors or red, green, and blue phosphors. The blue and yellow phosphor may be included together in the first lens or the second lens, or separately with one in the first lens and one the second lens. The red, green, and blue phosphors may be included together in the first lens or the second lens, or separately in different combinations. For example, the blue phosphor may be in the first lens and the red and green phosphor may be together in the second lens. In another example, the blue and green phosphor may be included in the first lens and the red phosphor may be included in the second lens. In yet another example, the blue phosphor is used in both the first and second lens to minimize the transmittance of UV light. The first lens may include green phosphors and the second lens may include red phosphors in addition to the blue phosphor throughout.

In certain embodiments, the second lens glue 51 includes at least one phosphor material. Because the second lens is located distally from the first lens, a phosphor material that is more sensitive to thermal cycling may be included in the second lens and not in the first lens.

Note that while the figures show the second lens appearing to have approximately equal thickness, uniform thickness is not required. In fact, optical considerations may require different thicknesses azimuthally. An LED die tends to generate light unevenly at different angles—more intense light is directed perpendicularly away from the LED die. To have a uniform color through the lens at all angles, more phosphor may need to be included at about 90 degrees from horizontal. If the phosphor concentration is uniform throughout the lens material, then the thickness of the lens can vary to generate a uniform color mixture. Manufacturing irregularities may make perfect color uniformity impossible. Thus a non-uniform color mixture that cannot be easily perceived with the human eye may be considered nevertheless to be a uniform color mixture.

Figure 10:
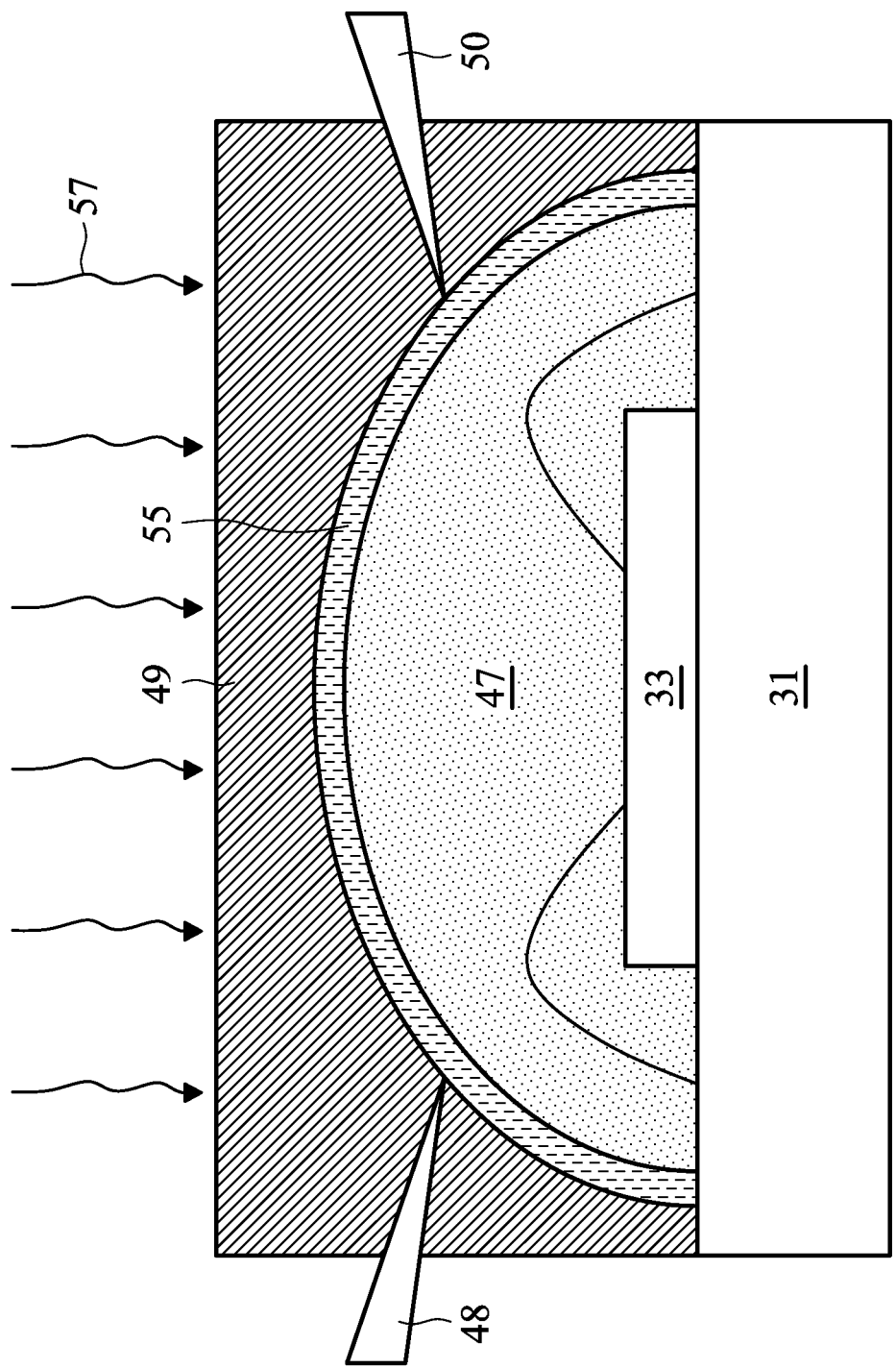

The second molded lens is cured in operation 27 of FIG. 1 and depicted in FIG. 10. Depending on the material used for the second lens 55, the curing operation may be similar to operation 21 for the first lens. However, the first lens and the second lens may include different materials that need to be cured differently. The lens material may be cured through the second lens mold by exposing the mold to an energy source 57, such as UV light, thermal radiation, microwave, or other energy or radiation, which can cure the material effectively.

Figure 11:
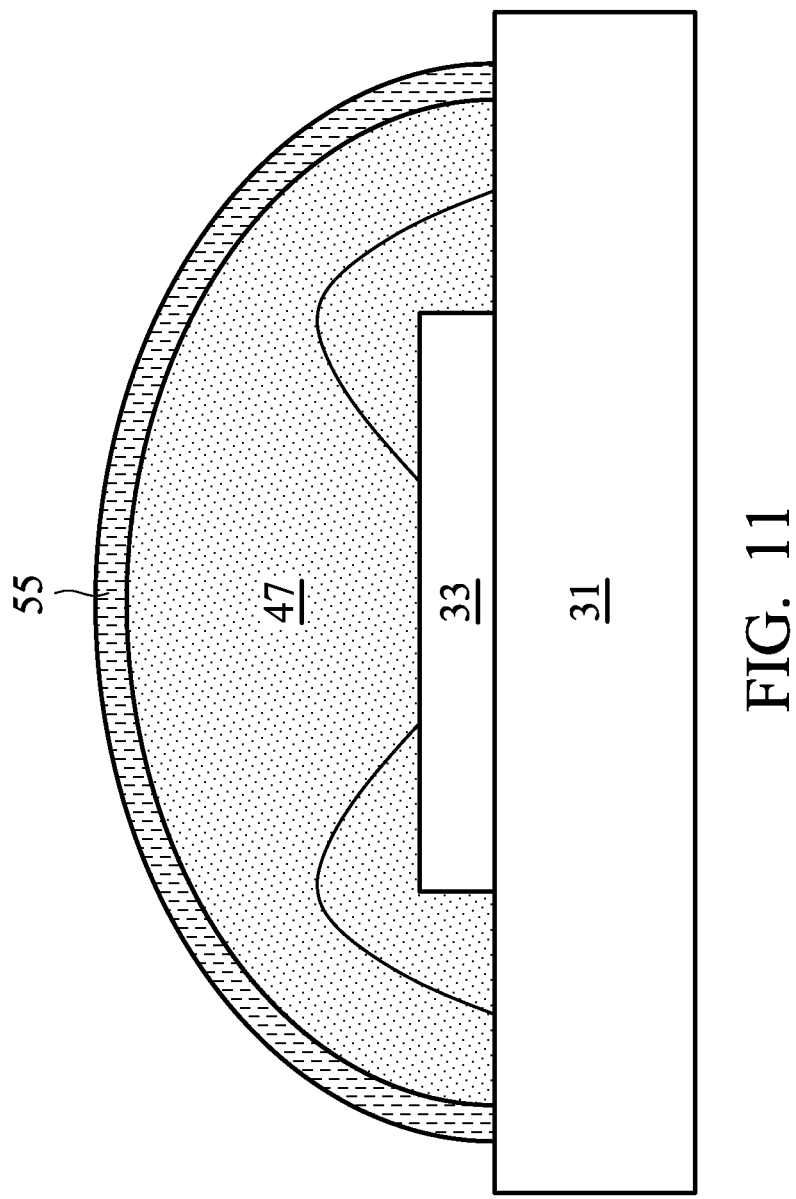

FIG. 11 shows the optical emitter after the second lens mold is removed. When a current is passed through the LED die 33, the light emitted by the LED die is transmitted through the first lens 47 and then the second lens 55. The phosphor material converts a portion of the light emitted to a light of a different wavelength and allows a portion of the light to pass through. Together, the passed through light and the converted light are perceived. Although a white light is usually generated this way, the concepts may be used to generate LED light of any color.

The foregoing has outlined features of several embodiments so that those skilled in the art may better understand the claims that follow. Those skilled in the art should appreciate that they may readily use the present disclosure as a basis for designing or modifying other processes and structures for carrying out the same purposes and/or achieving the same advantages of the embodiments introduced herein. It is understood, however, that these advantages are not meant to be limiting, and that other embodiments may offer other advantages. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An optical emitter comprising:
   a Light-Emitting Diode (LED) die;
   a package substrate attached to one side of the LED die;
   electrical connections connecting the LED die and the package substrate;
   a first molded lens bonded to the package substrate directly contacting the LED die, wherein the first molded lens contains a first phosphor material that is dispersed throughout the first molded lens; and
   a second molded lens over and bonded to the first molded lens such that the second molded lens is in direct contact with the first molded lens, the second molded lens including at least one second phosphor material dispersed within the second molded lens, wherein an index of refraction of the first molded lens is higher than an index of refraction of the second molded lens, wherein the first molded lens and the second molded lens are each a portion of an ellipsoid, and wherein the ellipsoid of the first molded lens has unequal equatorial radii.

2. The optical emitter of claim 1, wherein the first molded lens includes one or more phosphor material.

3. The optical emitter of claim 1, wherein the at least one phosphor material in the second molded lens is a mixture of two or more phosphor materials.

4. The optical emitter of claim 1, wherein the ellipsoid of the first molded lens and the ellipsoid of the second molded lens have a same center point.

5. The optical emitter of claim 1, wherein the first molded lens is a silicone, a resin, an epoxy, or a Poly(methyl methacrylate) PMMA.

6. The optical emitter of claim 1, wherein the first molded lens and the second molded lens have refractive indices of between about 1.4 and 1.6.

7. An optical emitter comprising:
a Light-Emitting Diode (LED) die;
a package substrate attached to one side of the LED die;
electrical connections connecting the LED die and the package substrate;
a high refractive index coating applied directly on the LED die;
a first molded lens bonded to the package substrate over the high refractive index coating; wherein an index of refraction of the high refractive index coating is lower than an index of refraction of the LED die and higher than an index of refraction of the first molded lens, and wherein the index of the refraction of the high refractive index coating is within ten percent of an average between the index of refraction of the LED die and the index of refraction of the first molded lens; and
a second molded lens disposed over and bonded to the first molded lens, wherein an index of refraction of the second molded lens is lower than an index of refraction of the first molded lens, and wherein the second molded lens contains phosphor.

8. The optical emitter of claim 7, further comprising a phosphor coating between the high refractive index coating and the first molded lens.

9. The optical emitter of claim 7, wherein the index of refraction of the high refractive index coating is within ten percent of the average between the index of refraction of the LED die and the index of refraction of the first molded lens.

10. The optical emitter of claim 7, wherein the index of refraction of the high refractive index coating is between about 1.6 and about 1.9.

11. The optical emitter of claim 7, wherein in the high refractive index coating is an epoxy material and has a thickness of about 1 mm.

12. The optical emitter of claim 7, wherein the first molded lens and the second molded lens are each a portion of an ellipsoid.

13. The optical emitter of claim 7, wherein the ellipsoid of the first molded lens has unequal equatorial radii.

14. A method of fabricating an optical emitter, comprising:
attaching a Light-Emitting Diode (LED) die to a package substrate;
electrically connecting the LED die and the package substrate;
applying a high refractive index coating directly on the LED die;
placing a first lens mold over the package substrate and the LED die;
thereafter inserting a first lens glue into the first lens mold, thereby forming a first molded lens, wherein the first molded lens is a portion of an ellipsoid having unequal equatorial radii;
thereafter curing the first molded lens;
thereafter placing a second lens mold over the first molded lens;
thereafter inserting a second lens glue into the second lens mold, thereby forming a second molded lens; and,
thereafter curing the second molded lens.

15. The method of claim 14, wherein the inserting a first lens glue and the inserting a second lens glue include evacuating a space inside the first lens mold and the second lens mold.

16. The method of claim 14, wherein the curing a first or second molded lens comprises exposing the first or second lens glue to ultraviolet light through the first or second lens mold or heating the first or second lens glue.

17. The method of claim 14, wherein second lens glue includes at least one phosphor material.

18. The method of claim 14, wherein an index of refraction of the first molded lens is higher than an index of refraction of the second molded lens.

19. The method of claim 14, wherein the first lens glue and the second lens glue are each a silicone, a resin, an epoxy, or a Poly(methyl methacrylate) PMMA.

20. The method of claim 14, wherein the second molded lens is a portion of a further ellipsoid.

* * * * *